(12) United States Patent
Chen et al.

(10) Patent No.: US 10,006,822 B2
(45) Date of Patent: Jun. 26, 2018

(54) SEMICONDUCTOR SENSOR ASSEMBLY FOR HARSH MEDIA APPLICATION

(71) Applicant: MELEXIS TECHNOLOGIES NV, Tessenderlo (BE)

(72) Inventors: Jian Chen, Heist-op-den-Berg (BE); Laurent Otte, Brussel (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days. days.

(21) Appl. No.: 15/628,758

(22) Filed: Jun. 21, 2017

(65) Prior Publication Data
US 2017/0363492 A1 Dec. 21, 2017

(30) Foreign Application Priority Data

Jun. 21, 2016 (EP) ..................................... 16175422

(51) Int. Cl.
*H01L 29/49* (2006.01)
*G01L 9/00* (2006.01)
(Continued)

(52) U.S. Cl.
CPC .......... *G01L 9/0055* (2013.01); *G01L 9/0042* (2013.01); *G01L 19/0069* (2013.01); *G01L 19/0084* (2013.01); *G01L 19/06* (2013.01); *G01L 19/0627* (2013.01); *G01L 19/143* (2013.01); *H01L 29/84* (2013.01);
(Continued)

(58) Field of Classification Search
CPC . G01L 9/0055; G01L 9/0042; G01L 19/0069; G01L 19/06; G01L 19/06727; G01L 19/143
See application file for complete search history.

(56) References Cited

U.S. PATENT DOCUMENTS 5,438,876 A    8/1995 Lewis
7,992,441 B2   8/2011 Mulligan et al.
(Continued)

FOREIGN PATENT DOCUMENTS

GB    1547592 A    6/1979

OTHER PUBLICATIONS

European Search Report from EP Application No. 16175422.1, dated Dec. 6, 2016.

*Primary Examiner* — Michael Shingleton
(74) *Attorney, Agent, or Firm* — Workman Nydegger

(57) ABSTRACT

A semiconductor sensor assembly for use in a corrosive environment comprises a processing device comprising at least one first bondpad of a material which may be corroded by a corrosive component in a corrosive environment; a sensor device comprising at least one second bondpad consisting of and/or being covered by a first corrosion resistant material; at least one bonding wire for making a signal connection between the at least one first bondpad of the processing device and the second bondpad of the sensor device. The processing device is partially overmoulded by a second corrosion resistant material, and is partially exposed to a cavity in the corrosion resistant material, with the sensor device being present in the cavity. A redistribution layer is provided to enable signal connection between the processing device and the sensor device is physically made in the cavity while the second corrosion resistant material covers the first bondpad.

16 Claims, 11 Drawing Sheets

(51) Int. Cl.
*G01L 19/00* (2006.01)
*G01L 19/06* (2006.01)
*G01L 19/14* (2006.01)
*H01L 29/84* (2006.01)

(52) U.S. Cl.
CPC ............... *H01L 2224/05554* (2013.01); *H01L 2224/06* (2013.01); *H01L 2224/48137* (2013.01); *H01L 2224/48145* (2013.01); *H01L 2224/48247* (2013.01); *H01L 2224/48465* (2013.01); *H01L 2924/181* (2013.01); *H01L 2924/1815* (2013.01)

(56) References Cited

U.S. PATENT DOCUMENTS

| | | |
|---|---|---|
| 8,299,549 B2 | 10/2012 | Reinmuth et al. |
| 2007/0052047 A1 | 3/2007 | Hadjiloucas et al. |
| 2009/0218643 A1 | 9/2009 | Kaminaga et al. |
| 2010/0024563 A1 | 2/2010 | Mulligan et al. |
| 2012/0291560 A1* | 11/2012 | Kurtz ................... G01L 9/0055 73/727 |
| 2017/0363492 A1* | 12/2017 | Chen ...................... G01L 19/06 |

* cited by examiner

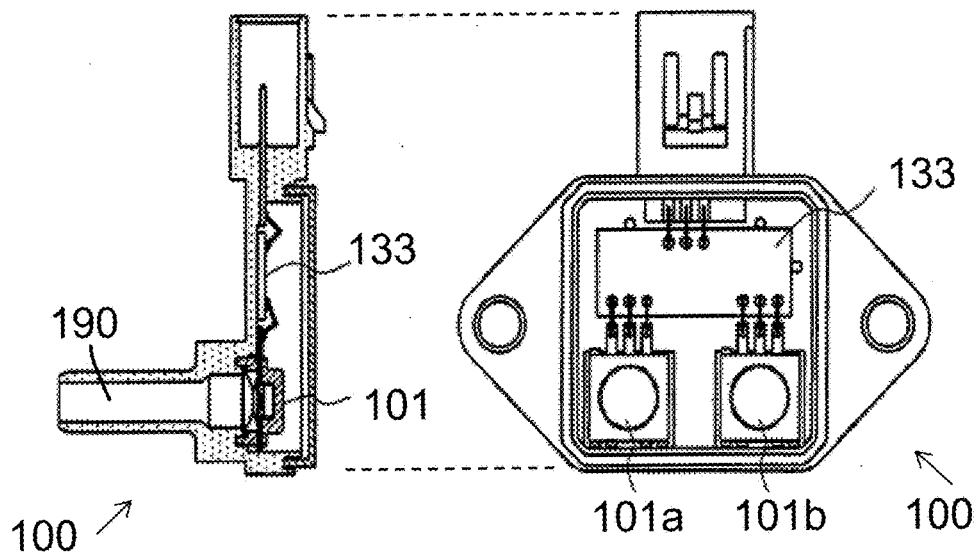
FIG 1 (prior art)   FIG 2 (prior art)
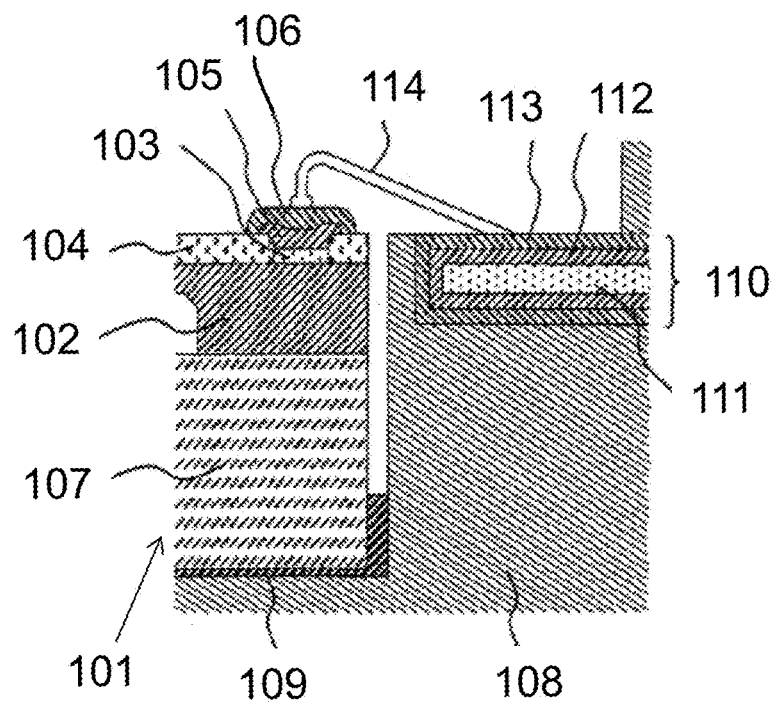
FIG 3 (prior art)

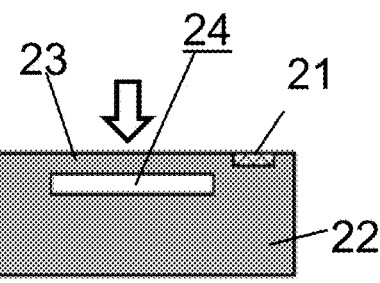 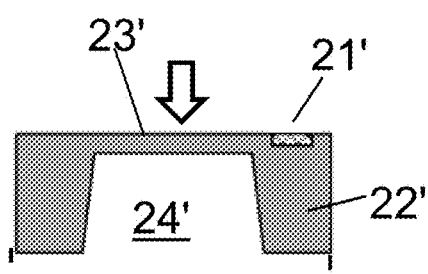
FIG 4          FIG 6
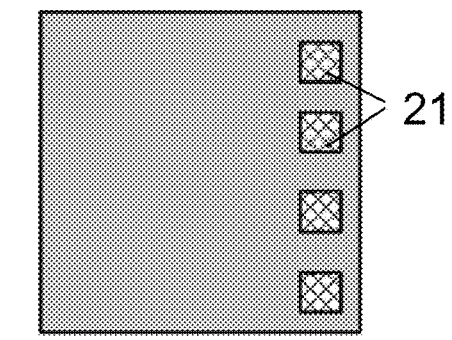 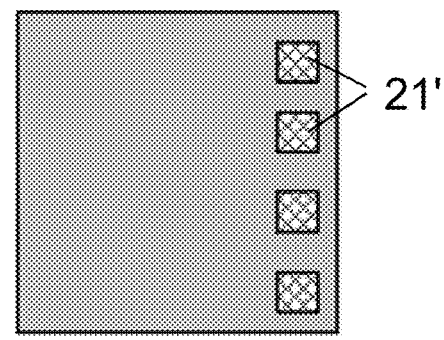
FIG 5          FIG 7

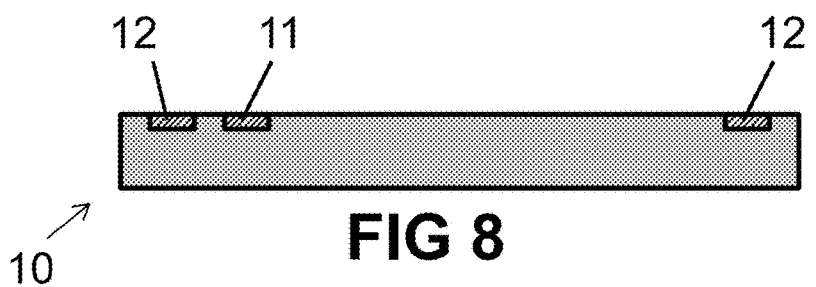
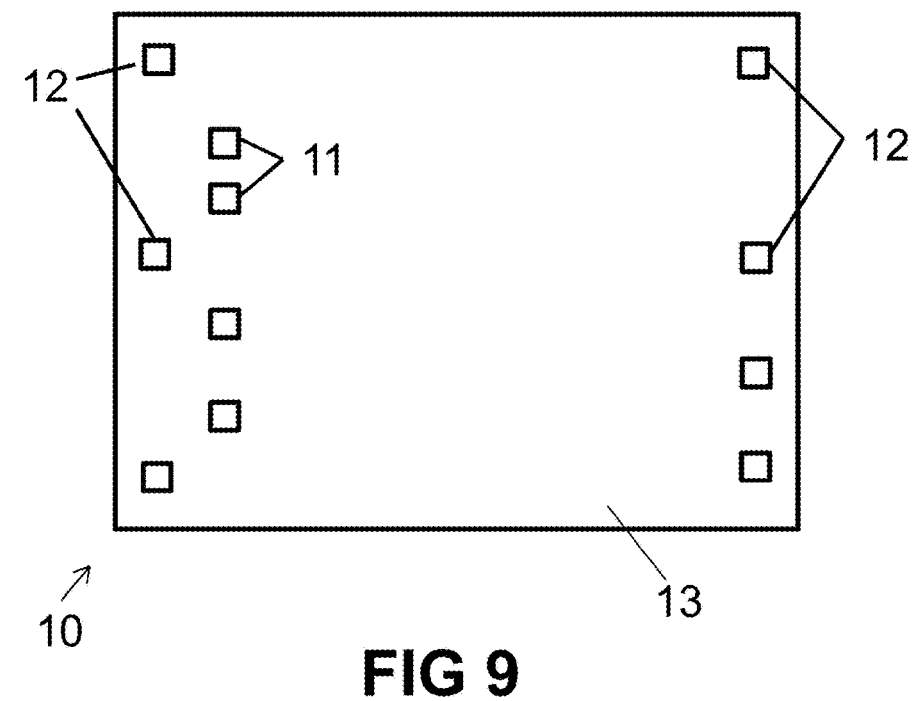

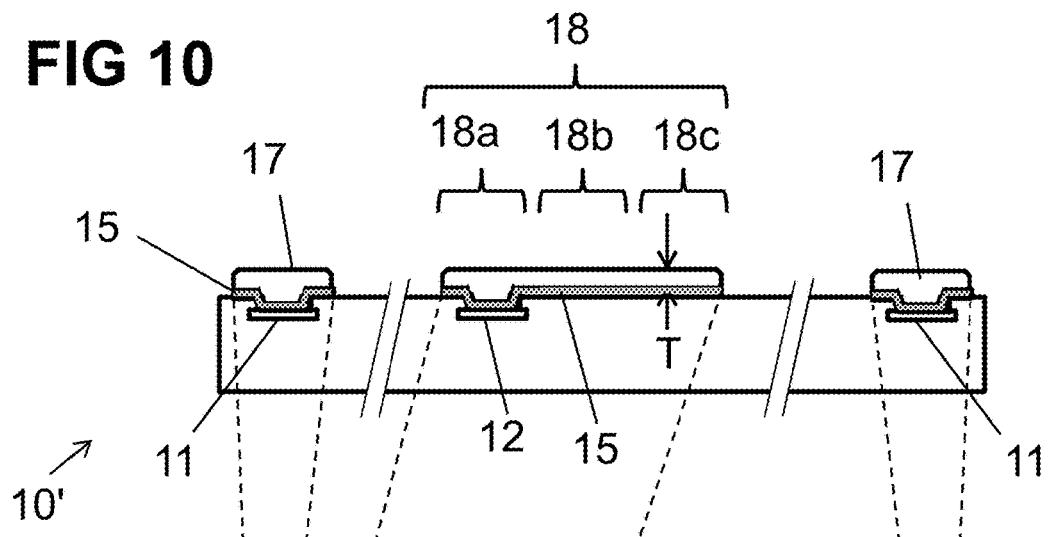
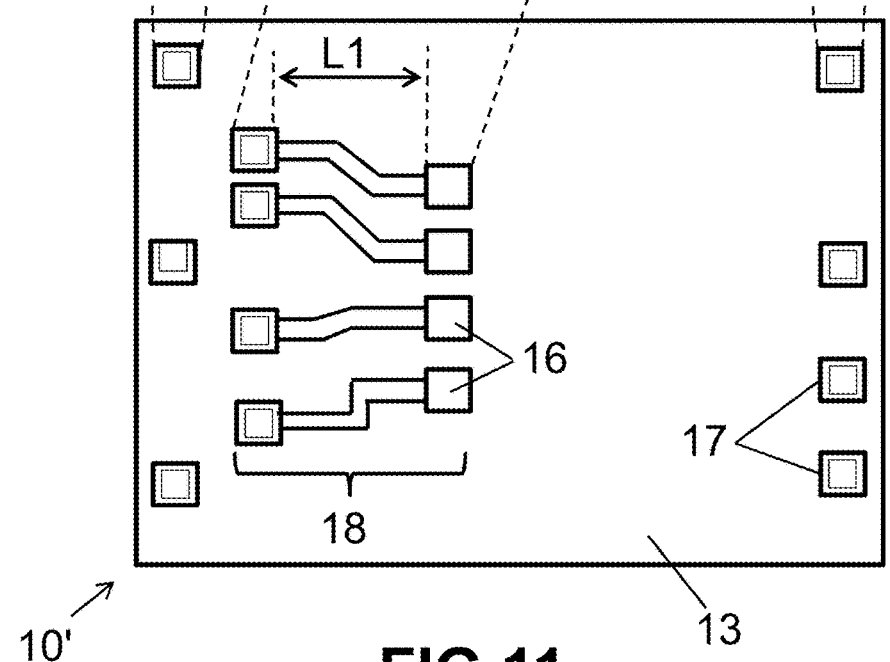

SEMICONDUCTOR SENSOR ASSEMBLY FOR HARSH MEDIA APPLICATION

FIELD OF THE INVENTION

The present invention relates to the field of semiconductor sensor devices, more in particular to a semiconductor sensor assembly suitable for use in a corrosive environment, e.g. an exhaust gas environment of an automobile engine, and methods of making same.

BACKGROUND OF THE INVENTION

Semiconductor sensors, e.g. pressure sensors for use in water or air under moderate temperatures and/or pressures are well known in the art.

A first type of such a pressure sensor is known for example from GB1547592A published in 1979. Typically such sensors comprise a substrate with a thinned portion (called "membrane" or "diaphragm") upon which membrane a pressure sensitive circuit is arranged, for example a Wheatstone-bridge comprising four piezo-resistive elements. Such a substrate typically further comprises four bondpads in electrical contact with nodes of the pressure sensitive circuit, for example two supply nodes for biasing the circuit with a voltage or current, and two output nodes for sensing a voltage indicative of the mechanical pressure exerted on the membrane by the fluid. Pressure sensors come in two variants: absolute pressure sensors and relative pressure sensors. Both are well known in the art, and hence need not be described in more detail here.

Although the basic principles of semiconductor pressure sensors have remained largely the same since 1979, there is continuous ongoing development in several directions, for example to add additional functionality on the same die, such as mechanisms for compensating offset and/or digital read-out circuitry, or to make the pressure sensors suitable for harsh media.

A second type of such a sensor is an infrared sensor as can be used for example for extracting information about the chemical composition of a fluid or gas, based on a measured infrared spectrum.

It is a challenge to make the sensor assembly suitable for a harsh environment. Existing solutions can be found for example in U.S. Pat. No. 7,992,441(B2) and US2009218643 (A1).

In US2007052047(A1) a solution is proposed based on Tantalum or Tantalum alloy.

U.S. Pat. No. 8,299,549 describes a layer structure with at least one noble metal layer in contact with an ohmic contact via an interconnection line.

There is always room for improvements or alternatives.

SUMMARY OF THE INVENTION

It is an object of embodiments of the present invention to provide a sensor assembly suitable for measuring a characteristic (e.g. a pressure or infrared spectrum) of a gas, e.g. an exhaust gas from an automobile, which gas contains corrosive components, wherein the assembly is of the type that comprises a separate sensor device (made in a first technology) and a separate processing device (made in a second technology, different from the first technology) electrically connected to said sensor device, and capable of withstanding the harsh environment, and to provide a method of making such a sensor assembly.

It is an advantage of embodiments of the present invention that such a sensor assembly has a reduced risk of corrosion and thus an improved lifetime, even in the presence of cracks or crevices.

It is an advantage of particular embodiments of the present invention that such a sensor assembly is more compact than prior art solutions.

The above objective is accomplished by a semiconductor sensor assembly and a method of producing such a semiconductor sensor assembly according to embodiments of the present invention.

In a first aspect, the present invention provides a semiconductor sensor assembly for use in a corrosive environment, e.g. an exhaust gas environment of an automobile engine. The sensor assembly comprises:

a processing device comprising at least one first bondpad of a material which may be corroded by a corrosive component, e.g. an exhaust gas, in the corrosive environment, e.g. the exhaust gas environment, a sensor device comprising at least one second bondpad, the second bondpad consisting of and/or being covered by a first corrosion resistant material; and at least one bonding wire for making a signal connection between the at least one first bondpad of the processing device and the at least one second bondpad of the sensor device.

The processing device is partially overmoulded by a second corrosion resistant material, for example corrosion resistant plastic material, and is partially exposed to a cavity in the corrosion resistant material. The sensor device is present in the cavity. Furthermore, a redistribution layer is provided to enable signal connection between the processing device and the sensor device to be physically made in the cavity while the second corrosion resistant material covers the at least one first bondpad.

The sensor device may be a discrete pressure sensor comprising only passive components, such as piezo-resistors. The pressure sensor may comprise a flexible membrane and a pressure sensitive circuit connected to a plurality of said second bondpads.

The processing device may be a CMOS chip, for instance having at least one aluminum pad and/or at least one copper pad.

It is an advantage of using a package, e.g. a plastic package, that encapsulates part of the processing device, that it prevents that part of the processing device from being exposed to the corrosive fluid. In particular for instance the parts of the processing device that are susceptible of corrosion by the gases and/or elements in the corrosive environment, e.g. exhaust environment, such as bondpads and vias, may be covered by the second corrosion resistant material. The corrosion resistant material can for example be an epoxy based, halogen free, "transfer moulding compound", but other suitable plastic materials may also be used. In other words, the mold compound, e.g. plastic mold compound, provides additional protection to make the sensor assembly more robust against the harsh environment.

In embodiments of the present invention, the redistribution layer may comprise or consist of an overpad metallization (OPM). The overpad metallization may consist of a third corrosion resistant material. It may have a shape comprising a proximal portion and a distal portion, the distal portion being located at a predetermined distance from the proximal portion and being connected to the proximal portion via an intermediate portion. The proximal portion may have a shape so as to cover the at least one first bondpad.

While competitors are focusing on adding additional metal layers on top of the bondpad of a material which may be corroded by corrosive components such as exhaust gas, e.g. aluminum or copper pad, which requires non-standard processes and additional masks, and multiple layers, or moving the processing chip away from the corrosive environment, the inventors of the present invention came to the idea of: moving the processing device closer to the sensor device; and adding a redistribution layer, e.g. an overpad metalization layer, over the pads, for instance using electroplating; and encapsulating part of the processing device, e.g. CMOS chip, and part of the redistribution layer, e.g. the proximal portion and part of the intermediate portion of the OPM, by a corrosion resistive packaging. In this way the length of a diffusion path which a corrosive particle needs to follow in order to reach the bondpad of a material which may be corroded by corrosive components such as exhaust gas, e.g. aluminum or copper pad, is increased.

In embodiments of the present invention, the bonding wire may have a first end connected to the distal portion of the overpad metalization, and a second end connected to the at least one second bondpad of the sensor device. The bonding wire may consist of a fourth corrosion resistant material.

Because the bond-wire and the redistribution layer, e.g. OPM, are made of corrosion-resistant materials, one part thereof can be exposed to the corrosive, e.g. exhaust, fluid, while another part can be encapsulated by corrosion-resistant material, e.g. plastic. Thus the transition between the "harsh world" and the "non-harsh world", e.g. "CMOS world" takes place on the intermediate portion, rather than at the contact interface of the CMOS chip, as is done in prior art solutions.

It is an advantage that molding a package, e.g. a plastic package, is a very mature process and is very well suitable for mass production in both the consumer and automotive industry.

It is an advantage of using a discrete or separate sensor and a discrete or separate processing chip, because this allows to use different technologies for the sensor and for the processing device, hence each can be separately produced and optimized depending on the envisioned applications or environments.

The redistribution layer, e.g. overpad metallization, can be applied by sputtering or by electroplating. It is an advantage of using an electroplated layer, thus a relatively thick layer of on top of the bondpads of a material which may be corroded by corrosive components such as exhaust gas, e.g. aluminum or copper pads, rather than only a thin coating, that it provides adequate protection also in case of pin holes or cracks. Preferably the redistribution layer, e.g. OPM layer, does not contain Ti.

By arranging the sensor device above the processing device, or directly adjacent the processing device without any intermediate objects, a compact arrangement can be provided. Compactness is highly desirable, not only for cost reasons, but also because it is advantageous to calibrate a smaller sensor assembly. Sensors such as pressure sensors need to be individually calibrated at different pressures and temperatures, for example for determining an offset value and/or sensitivity value which is typically different for each individual sensor. Having a more compact design allows to speed up the calibration process as the thermal mass of the sensor is reduced allowing for a faster temperature setting on the device, e.g. in the order of maximally 1.0 second per measurement. Or stated in other words, for a given time, more measurement points can be taken, thus the accuracy can be improved.

If so desired, not only the top side of the sensor assembly is covered or encapsulated with the second corrosion resistant material, e.g. plastic material, but also the bottom side. This is particularly relevant if the substrate is for example made of copper. But protection of the bottom side with corrosion resistant material, e.g. plastic material, can be omitted in applications where the corrosive components, e.g. exhaust gas, do not have access to the bottom side of the sensor assembly.

In an embodiment, the first corrosion resistant material and/or the third corrosion resistant material and the fourth corrosion resistant material is individually selected from one of the following alternatives: a noble metal; only gold; only platinum; a mixture consisting of only Au and Pt; an alloy containing Au or Pt.

In an embodiment, the first corrosion resistant material can be a first noble metal, and the third corrosion resistant material can be a second noble metal and the fourth corrosion resistant material can be a third noble metal. The first noble metal and the second noble metal and the third noble metal may be one and the same noble metal, but that is not absolutely required, and the second noble metal may be different from the first noble metal, and the third noble metal may be different from the first and/or the second noble metal.

In a preferred embodiment, the first and second and third noble metal is gold.

In another preferred embodiment, the first and second and third noble metal is platinum.

Gold and/or platinum are highly corrosion resistant materials, and excellent electrical conductors. Bonding with gold wires is a standard and very mature process.

In an embodiment, the sensor device is mounted on top of a substrate and adjacent the processing device.

In an embodiment, the sensor device is located on top of the processing device.

This arrangement allows the sensor device to be located in a cavity formed in the overmoulded package, e.g. plastic package, and the processing device to be arranged partially inside or underneath the cavity.

In an embodiment, the semiconductor sensor assembly further comprises a passivation layer on top of the redistribution layer, e.g. overpad metalization, for example made of SiN.

The additional passivation layer, e.g. made of SiN or poly-imide or PBO improves the corrosion resistance even more.

In an embodiment, the semiconductor sensor assembly further comprises a gel applied in the cavity on top of the sensor device.

It is an advantage of providing a gel on top of the sensor device, e.g. pressure sensor, because it prevents any debris, dust or moisture from having direct access to the sensor. It also provides mechanical protection to the first bonding wires, and electrically and it mechanically isolates the bonding wires against e.g. moisture. Suitable gels are for example silicone based or fluoro gels, but other gels may also be used.

In particular embodiments of the present invention, the processing device is partially overmoulded by the second corrosion resistant material, and is further partially exposed to a cavity in the second corrosion resistant material in which the sensor device is provided, which cavity is filled up with the gel.

It is particularly advantageous if all bondpads of the processing device that are made of a material which may be corroded by corrosive components such as exhaust gas, e.g. aluminum or copper pads, are located in that part of the processing device which is overmoulded by the second corrosion resistant material, such that none of these bondpads are available in the cavity, either filed with gel or not.

In an embodiment, the semiconductor sensor assembly comprises a substrate, whereby the substrate is a lead frame.

The substrate can for example be a Cu lead frame, or can be made of another material.

In an embodiment, the processing device further comprises third bondpads connected to the substrate via second bonding wires, the second bonding wires also being encapsulated by the second corrosion resistant material.

The second bonding wires can be made of the same material as the first bonding wires. Preferably these bonding wires are made of gold or platinum.

In an embodiment, the processing device is a CMOS chip, and the sensor device is made in a different technology than the CMOS chip.

CMOS is the technology of choice for mass production, in particular in the Consumer Electronics and Automotive industry. The assembly technique described herein allows to produce a heterogeneous sensor combining the best of both worlds. CMOS technology is ideal for implementing the control unit The other, different technology can for example be III-V technology, or based on GaAs or based on InP, but can also comprise discrete components.

In an embodiment, the CMOS chip comprises a microprocessor and a non-volatile memory.

It is an advantage of such assembly, that a "smart" sensor assembly can be made, which can process the signals from the sensor digitally. Preferably this integrated circuit comprises a non-volatile memory for storing for example inter alia calibration data, such as offset data. Such an assembly can provide highly accurate data.

In an embodiment, the semiconductor sensor assembly has outer dimensions smaller than 5 mm×10 mm×8 mm, for example smaller than 2.4 mm×5.0 mm×4.0 mm, for example smaller than 2.0 mm×3.0 mm×3.0 mm, for example smaller than 1.5 mm×2.0 mm×2.0 mm.

It is a major advantage of embodiments according to the present invention that the outer dimensions of the assembly can be chip scale, which is extremely compact. Such assembly can be mounted nearly everywhere, without noticeably or significantly influencing the flow of the fluid to be measured.

In an embodiment, the sensor device is an absolute pressure sensor or a differential pressure sensor or an infrared sensor.

The pressure sensor may comprise a plurality of piezoresistive elements arranged in a bridge circuit or a differential sensing circuit, the nodes of the bridge circuit being electrically connected to the first bondpads.

Pressure sensors with a membrane on top of which piezo-resistors are arranged, connected in a bridge, e.g. a Wheatstone bridge, are ideally suited for converting even small pressure changes into a voltage signal.

According to a second aspect, the present invention relates to the use of a semiconductor sensor assembly according to the first aspect for measuring a pressure and/or a composition of a corrosive gas, e.g. an exhaust gas of an automobile engine.

According to a third aspect, the present invention relates to a method of manufacturing a semiconductor sensor assembly. The method comprises the steps of:

providing a processing device comprising at least one first bondpad of a material which may be corroded by a corrosive gas, e.g. an exhaust gas, in the corrosive environment, e.g. exhaust gas environment, providing a sensor device comprising at least one second bondpad, the second bondpad consisting of and/or being covered by a first corrosion resistant material;

making a signal connection between the at least one first bondpad of the processing device and the at least one second bondpad of the sensor device by means of at least one bonding wire, partially overmoulding the processing device by a second corrosion resistant material, the processing device thus being partially exposed to a cavity in the second corrosion resistant material, mounting the sensor device in the cavity, and providing, before partially overmoulding the processing device, a redistribution layer to enable the signal connection between the processing device and the sensor device to be physically made in the cavity while the second corrosion resistant material covers the at least one first bondpad.

Preferably no Ti is used for depositing the redistribution layer, OPM.

Optionally the method may comprise a further step of adding a gel coating on top of the sensor device, e.g. in the cavity.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1 and FIG. 2 show a pressure sensor assembly known in the art, in side view and in top view respectively. The assembly comprises a pressure sensor and a discrete processing board.

FIG. 3 shows in more detail how the pressure sensor of FIG. 1 is connected to the discrete processing board in the prior art pressure sensor assembly.

FIG. 4 and FIG. 5 are a schematic representation (in side view and top view) of an exemplary discrete absolute pressure sensor as can be used in embodiments of the present invention, but the present invention is not limited to this specific example (e.g. having a square cross section and having four bondpads), and other absolute pressure sensors may also be used.

FIG. 6 and FIG. 7 are a schematic representation (in side view and top view) of an exemplary discrete relative or differential pressure sensor as can be used in embodiments of the present invention, but the present invention is not limited to this specific example (e.g. having a square cross section and having four bondpads) and other relative pressure sensors may also be used.

FIG. 8 and FIG. 9 are a schematic representation (in side view and top view) of an exemplary processing device having aluminum or copper pads (e.g. a CMOS chip) as can be used in embodiments of the present invention, but the present invention is not limited to this specific example of processing device (e.g. having eleven contacts on top) and other processing devices can also be used.

FIG. 10 and FIG. 11 show a processing device (in side view and in top view) similar to that shown in FIG. 8 and FIG. 9, with the addition of overpad metallization (abbreviated herein as "OPM") over at least some of the aluminum or copper pads of said processing device. In FIG. 10 and FIG. 11 all pads have OPM on top. Such processing devices with OPM can be used in embodiments of the present invention.

Figure 12:
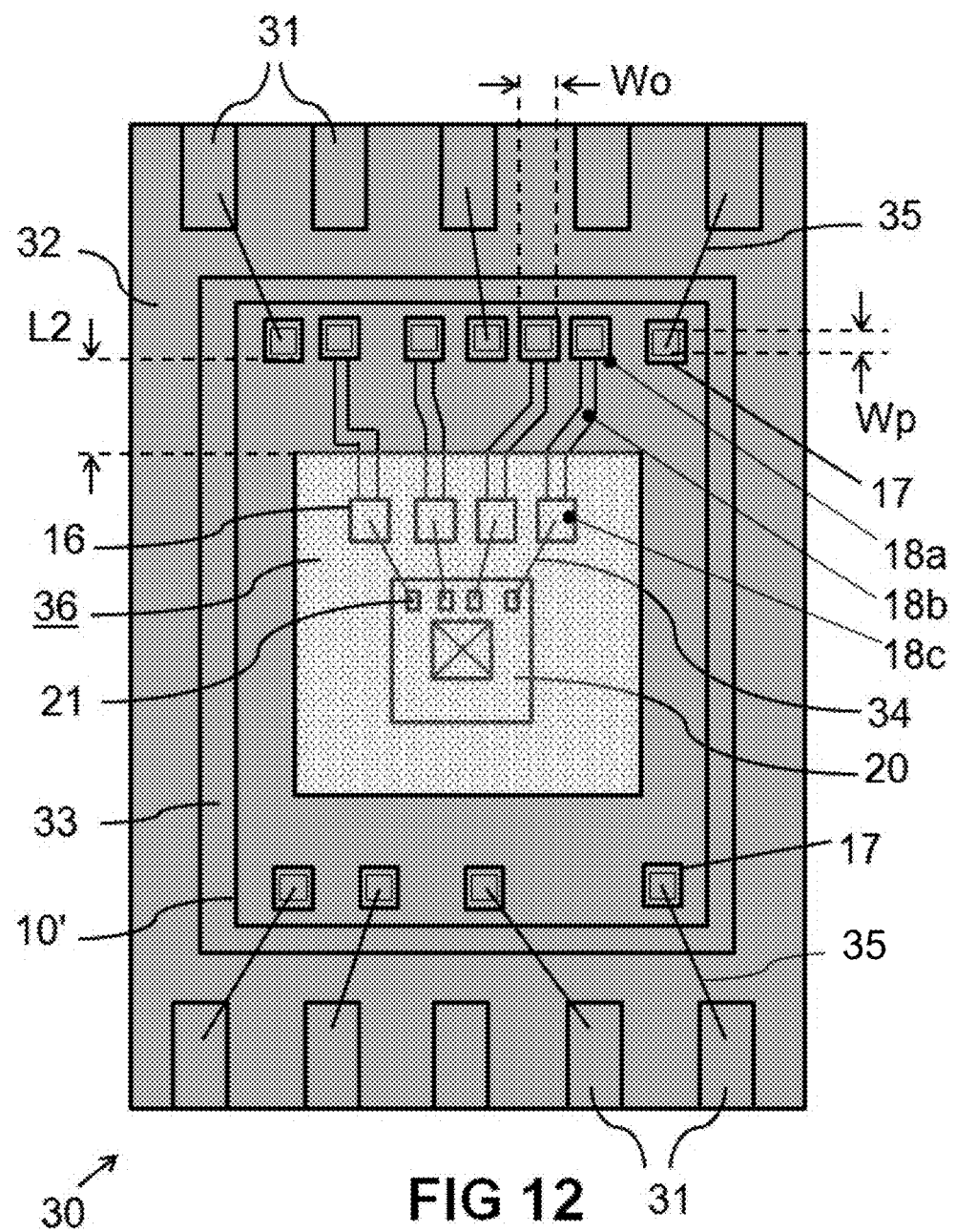
FIG. 12 shows a sensor assembly (in top view) according to an embodiment of the present invention, comprising a sensor device similar to that shown in FIG. 4 and FIG. 5 or that of FIG. 6 and FIG. 7 and a processing device with OPM similar to that shown in FIG. 11. The processing device is mounted on top of a substrate, e.g. a lead frame. The sensor device is mounted on top of the processing device.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document the terms "processing chip" and "processing device" are used as synonyms.

In this document the terms "sensor chip" and "sensor device" are used as synonyms.

In this document, reference is made to exhaust gas environment and exhaust gases. This is in no way intended to be limiting, but is rather an example of an application domain for aspects and embodiments of the present invention.

In this document, the terms plastic material, overmoulding material, mould component, second corrosion resistant material all refer to the same thing. The terms can be used as synonyms.

The present invention provides a sensor assembly for use in a corrosive gas environment, e.g. an exhaust gas environment of an automobile engine, e.g. a pressure sensor assembly for measuring an absolute or a relative pressure of a corrosive gas, such as an exhaust gas of an automobile vehicle, or an infrared sensor assembly for measuring an infrared characteristic (e.g. an absorption or transmission characteristic). Such an exhaust gas typically contains corrosive components such as e.g. nitrite ions. In the rest of the document, the invention will only be explained referring to the term "exhaust gas", but the invention will also work for other fluids having corrosive components.

It is well known in the prior art that exhaust gas of a vehicle is corrosive for metals such as for example aluminum or copper and the like, but these metals are typically used for building a lead frame and for metallization of semiconductor devices, especially CMOS devices. Therefore, techniques are proposed in the prior art to prevent or reduce corrosion.

FIG. 1 and FIG. 2 show a pressure sensor assembly 100 known from US2009/0218643(A1), in side view and top view respectively. This pressure sensor assembly has two pressure sensors 101a, 101b connected to a discrete processing board 133 by means of so called "terminals" 111 (see FIG.3). The pressure sensors 101 are located in a cavity in fluid communication with the exhaust gas via channel 190, whereas the processing board 133 is not or only partially exposed to said gas, and is located relatively far away from the pressure sensors.

FIG. 3 shows that the prior art pressure sensor 101 comprises a sensor chip 102, mounted on a glass substrate 107, adhered to a case 108 via an adhesive 109. The sensor chip has a SiN protective layer 104 on top, in which openings are made for electrical contact with the pressure sensitive circuit (not shown). The openings contain aluminum 103, the aluminum is covered with TiW, in turn covered with a gold coating 106. The gold coating must be sufficiently thick ("not less than 0.5 micrometer"), which is very thick and thus very expensive. The gold coating 106 is then connected via a golden bonding wire 114 to a so called terminal 110 for electrical contact with the processing board 133 (see FIG. 2). The terminal 110 is a multi-layer stack comprising a "base material" (presumably aluminum or copper) plated with a Ni layer 112, and the Ni layer is plated with a gold layer 113.

The inventors of the present invention were confronted with the task of providing a sensor assembly having a sensor device and a processing device, but having a decreased risk of corrosion, in particular of the processing device.

Briefly stated, they provided a sensor chip (e.g. a pressure chip, or a MEMs device) and a processing chip (e.g. a CMOS device with aluminum pads, standard passivation layer, etc.)

In order to decrease the risk of corrosion, they came to the following ideas:

i) to move the processing chip closer to the exhaust channel by mounting the sensor chip and the processing chip on a single substrate, e.g. a lead frame. Moving the processing chip closer to the corrosive environment is counter-intuitive, because the closer to the exhaust channel, the higher the concentration of corrosive components or particles, ii) to cover some or all of the aluminum contact pads of the processing chip with a relatively thick electroplated or sputtered metallization (OPM) of a corrosive resistant material, e.g. a layer of pure gold, with a thickness of at least 0.6 µm, e.g. at least 0.8 µm, e.g. at least 1.0 µm, e.g. at least 2.0 µm, e.g. at least 2.5 µm, e.g. at least 3.0 µm, e.g. at least 4.0 µm, e.g. at least 5.0 µm. This drastically decreases the risk of particles diffusing through the gold layer.

In order to be able to use electroplating, a so called "seed layer" needs to be provided in manners known in the art (e.g. by means of sputtering). The seed layer may comprise a stack of several layers, as is also known per se in the art. In order to allow communication between the processing chip and the sensor chip, bond wires are provided. Since these bond wires are exposed to the exhaust medium, bondwires of a corrosion resistant material are chosen, e.g. made of gold or platinum.

But the inventors went one step further. After careful consideration, the inventors realized that corrosion of the aluminum pads cannot only occur by particle diffusion through the relatively thick gold layer (or pin holes or cracks therein), but also via the seed layer located between the aluminum pad and the thick gold layer, and they came to the further idea of:

iii) overmoulding the processing device and part of the OPM with a suitable overmoulding, e.g. plastic, material, while leaving the sensor device (or at least part thereof) exposed to the exhaust gas. They found that in this way the length of the diffusion path in order to reach the aluminum pad from the environment outside the plastics package can be effectively increased.

While encapsulation of a processing device, e.g. a CMOS device with a plastic material per sé is well known in the art, the particular arrangement and combination of features described above for solving or improving the problem of corrosion, is not trivial, and even counter-intuitive.

The proposal goes against the general idea that the CMOS chip must not be located in or under the cavity that is in fluid connection with the exhaust gas.

In one embodiment, the inventors came to the further idea of stacking the pressure sensor on top of the CMOS chip, thereby achieving ultimate compactness.

This describes some of the underlying ideas of the present invention.

It is noted that this assembly technique allows a processing device made in CMOS technology to be connected to a sensor device not made in CMOS technology, in other words, to produce a hybrid or heterogeneous device combining the best of "both worlds": a sensor device made in a first technology that is highly corrosion resistant (e.g. using pure Pt metallization), and a processing device made in CMOS, which is the technology of choice for mass products such as Consumer Electronics and automotive products.

Before describing actual embodiments of a sensor assembly according to the present invention, the individual components: a discrete sensor device (e.g. a pressure sensor), and a processing device (e.g. a CMOS chip), will be briefly described next.

FIG. 4 and FIG. 5 are a schematic representation (in side view and top view) of an exemplary discrete absolute pressure sensor 20 as can be used in embodiments of the present invention. In fact, only very few details of the absolute pressure sensor 20 are shown: a substrate 22 having a thinned portion forming a membrane 23 (also known as diaphragm) and contact pads 21 connected with a pressure sensitive circuit (not shown) located on the membrane 23. The pressure sensitive circuit may comprise four piezo-resistors arranged in a Wheatstone-bridge, but another pressure sensitive circuit could also be used. Pressure sensors of the type described above (having a membrane and a piezo-resistive structure) are well known in the art, and hence need not be further described here.

In fact, any pressure sensor can be used, provided that it is adequately protected for exposure to the fluid, e.g. exhaust gas. Such protection may for example include, the present invention not being limited thereto, (a) the membrane being covered by a protective layer such as e.g. silicon nitride, and (b) the electrical contact(s) 21, e.g. made of aluminum, being covered with gold, with a diffusion prevention layer such as e.g. TiW in between. Other sensor devices may contain for example only Pt metallization, or may comprise Tantalum as corrosion resistive metal.

The absolute pressure sensor 20 shown in FIG. 5 has four contact pads 21, but the present invention is not limited to pressure sensors having only four contact pads, and pressure sensors having more than four, or less than four contact pads 21 may also be used. In the example shown in FIG. 5, the contact pads 21 are linearly aligned, but that is not necessary for the present invention, and other positions can also be used.

FIG. 6 and FIG. 7 are a schematic representation (in side view and top view) of an exemplary discrete relative or differential pressure sensor 20' as can be used in embodiments of the present invention, but embodiments of the present invention are not limited to this specific example. Everything mentioned above for the absolute temperature pressure 20 is also applicable for the relative pressure sensor 20', except that the cavity 24' underneath the membrane 23' of the relative pressure sensor 20' is accessible from the backside, whereas the cavity 24 of the absolute pressure sensor 20 is not accessible from the backside. Embodiments of assemblies according to the present invention can work with absolute pressure sensors 20 like the one shown in FIG. 4 and FIG. 5, or with relative pressure sensors 20' like the one shown in FIG. 6 and FIG. 7, but may also work with other pressure sensors.

As described above, the present invention will also work with other kind of sensor devices, for example infrared sensor devices, typically having at least one window transparent to infrared light, but for the present invention it suffices to say that the sensor is adequately protected against the corrosive gas (e.g. by one or more protection layers), and has at least one contact pad, which is to be connected to a processing device, in a manner which will be described further.

FIG. 8 and FIG. 9 are a schematic representation (in side view and top view) of an exemplary processing device 10, e.g. a CMOS chip. In what follows, sometimes the term "CMOS chip" will be used instead of "processing device", but the present invention is not limited thereto, and processing devices made in another technology can also be used, for example processing devices made in III-V technology.

The processing device 10 can be any integrated semiconductor device, e.g. pure analog, or mixed analog and digital, and may comprise a programmable processor with a non-volatile memory, etc. But the functionality of the processing device, or the technology in which the processing device is made is not the main focus of the present invention, apart from the fact that the processing device 10 contains aluminum or copper bondpads on its surface. Therefore only minor details of the processing device are shown in FIG. 8 and FIG. 10, namely: a semiconductor substrate 13 and bondpads 11, 12. The bondpads are typically made of aluminum, hence, would corrode if exposed to the exhaust gas of automobile vehicles without protection.

In the example of FIG. 8 and FIG. 9 the processing device has eleven pads, but the present invention is not limited to this number of pads and to the specific arrangement shown in FIG. 9, and a processing device 10 with a number of pads higher or lower than eleven can also be used. In the example of FIG. 8 and FIG. 9 the pads are arranged in three columns, but that is not required, and other suitable arrangements would also work.

FIG. 10 and FIG. 11 show a processing device 10' (in side view and in top view) similar to that shown in FIG. 8 and FIG. 9, but with the addition of a redistribution layer in the form of an "overpad metallization" (abbreviated herein as "OPM") over at least some (but preferably all) of the aluminum pads 11, 12 of said processing device.

According to the present invention, the overpad metallization consists of a relatively thick layer of corrosion resistant material, e.g. a layer of a noble metal, e.g. pure gold.

Preferably, this layer is applied via electroplating, which is a well-known technique, and therefore need not be explained in full detail here. Suffice it to say that typically first a seed layer 15 is applied on top of the aluminum, e.g. by sputtering. The seed layer 15 functions as adhesive layer, and as diffusion barrier, and may comprise TiW/Au. The noble metal is added by electroplating on top of the seed layer. The thickness T of the electroplated layer can for example be about 1.0 or about 2.0 or about 3.0 or about 4.0 or about 5.0 μm, or even more than 5 μm.

But the corrosion resistant material can also be deposited in other ways, e.g. by sputtering.

As can be seen in the example of FIG. 9 to FIG. 11, the aluminum pads with reference 12 have a "square" overpad metallization 11 completely covering the aluminum pad, while the aluminum pads with reference 11 have an OPM with a shape not only comprising the local "square" shape, referred to herein as "proximal portion" 18a, but also have a "distal portion" 18c, located at least a predefined distance "L1" apart from the proximal portion 18a of the OPM. The proximal portion 18a and the distal portion 18c are interconnected via an "intermediate portion" 18b, in the example shown in FIG. 11 having a zig-zag line, but that is not absolutely required, and the intermediate portion 18b of the OPM may also be a straight line. In the example shown, the distal portion 18c also has a square shape to function as a redistribution pad 16, as will be described further, but that is not absolutely required, and other suitable shapes can also be used.

Figure 13:
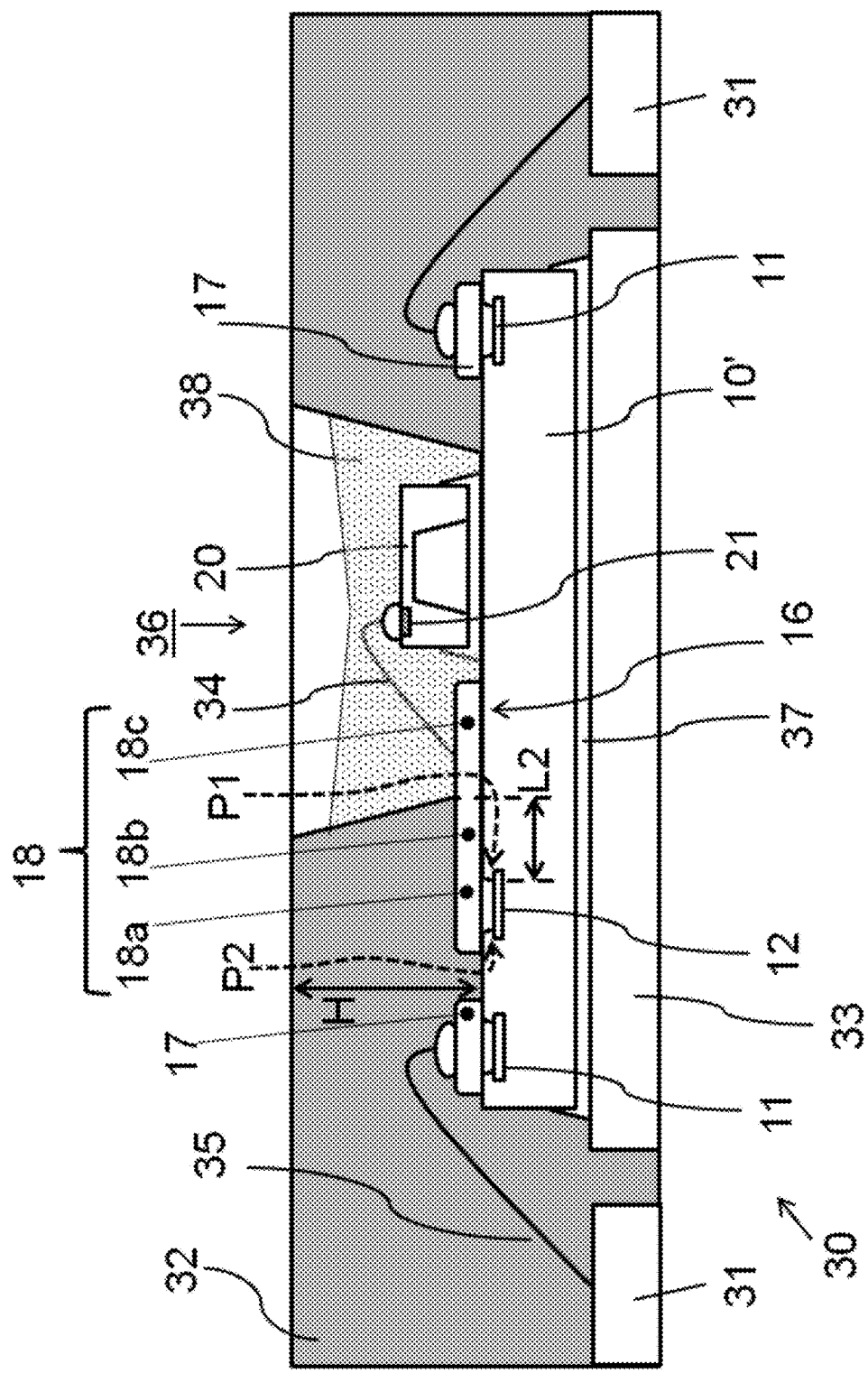
FIG. 13 shows a sensor assembly similar to that shown in FIG. 12 in side view (but some pads are shifted for illustrative purposes).

FIG. 12 shows a sensor assembly 30 according to an embodiment of the present invention, in top view. FIG. 13 shows a sensor assembly very much similar to that shown in FIG. 12 in side view, except that some pads are shifted inwardly for illustrative purposes. Apart from this minor difference, FIG. 12 and FIG. 13 can be considered as a top view and side view of a sensor assembly 30 according to an embodiment of the present invention.

The sensor assembly 30 comprises a substrate 33, e.g. a lead frame, and a processing device 10' with OPM, e.g. a CMOS processing device like the one shown in FIG. 10 and FIG. 11, and a sensor device 20, e.g. an absolute pressure sensor like the one shown in FIG. 4 and FIG. 5. The processing device 10' with OPM is mounted on top of a lead frame 33. In the example, the sensor device 20 is mounted on top of the processing device 10'.

As can be seen, the distal portions 18c of the OPM, referred to as redistribution pads 16, are connected to the pads 21 of the sensor chip 20 by means of first bonding wires 34. These bonding wires are made of a corrosion resistant material, for example a noble metal or an alloy consisting only of noble metals.

At least one of the pads 11 are interconnected with package pins 31 of the lead frame 33 via second bonding wires 35. These bonding wires are typically also made of gold, despite the fact that they are not directly exposed, as described further.

As indicated in dark gray, an overmould 32 of a corrosion resistant plastic compound is applied in a manner to enclose at least the pads 11 and the corresponding OPM 17 on top thereof (e.g. the square portions on the pads 11), and to also cover the pads 12 with the proximal portion 18a of the OPM 18 and also a part of the intermediate portion 18b of the OPM 18 (e.g. at least a predefined distance "L2". The length L2 is preferably larger than 100 µm, e.g. later than 200 µm, e.g. larger than 300 µm, e.g. larger than 400 µm. The distal portions 18c functioning as redistribution pads 16 are not encapsulated by the plastic compound, i.e. they are left exposed. This can easily be achieved by a suitable shaping of the plastic mould compound, e.g. by forming a cavity 36 in the plastic such that the sensor device 20 is located in said cavity 36 (better visible in FIG. 13). An important advantage of the mould compound 32 is that the corrosive particles cannot directly reach the proximal portions 18a of the OPM, but first need to diffuse through the mould compound 32 or through the seed layer 15 before reaching the proximal portions 18a and then the aluminum pads 12. Even though the seed layer 15 (shown in FIG. 10) located under the OPM 18 ends in the cavity 36 (see FIG. 13), corrosive particles following path "P1" would have to diffuse at least over the predefined distance "L2" before reaching the aluminum pads 12. By increasing this distance "L2", the rate of corrosion can be drastically reduced, and thus the lifetime of the product can be drastically increased.

It is noted that, even though the technique of applying a plastic compound 32 on top of a processing device 10' with a relatively thick OPM layer (e.g. at least 2 µm, e.g. about 5 µm) is a simple technique, this does not mean that the combination of features, namely, (i) locating the processing device close to the sensor chip , and applying OPM on top of the processing chip and encapsulating that chip in a plastic package, is trivial. It appears that most competitors are searching in a completely different direction, namely by trying to find better protection layers directly on top of the processing device.

As mentioned above, FIG. 13 can be considered as a side view of a sensor assembly 30 of FIG. 12, except that some pads 12 are shifted for illustrative purposes. FIG. 13 shows the relative position of the elements described above in height direction (orthogonal to the plane of the processing device 10'). The sensor assembly 30 has a substrate 33, for example a lead frame comprising a die paddle (shown in the middle) and a plurality of package pins 31 on the left and right of FIG. 13. A processing device 10' with OPM 17, 18 similar to the one described in FIG. 10 and FIG. 11 is mounted on top of the substrate 33, e.g. by means of an adhesive or glue.

As described above, the processing device 10' may be a CMOS device with aluminum pads 11, 12. On top of the aluminum pads a seed layer 15 is applied (see FIG. 10). On top of the seed layer 15 a relatively thick layer of a noble metal, e.g. 5 µm of gold is applied as an overpad metalization (OPM) 17, 18. The width "Wo" of this overpad metallization 17 is typically about 50% larger (25% on each side) than the width "Wp" of the aluminum pads 11 (see FIG. 12), so as to completely cover the aluminum pad.

Referring back to FIG. 13, some of the pads, namely the pads with reference number 11, only have a local OPM 17, e.g. in the form of a square. The pads 11 may be connected to the package pins 31 via second bonding wires 35. These bonding wires 35 are encapsulated in the moulding compound 32, hence are not exposed to the corrosive fluid.

Some of the pads 12 have OPM 18 with an elongated shape (see also FIG. 10, FIG. 11 and FIG. 12). The OPM 18 comprises a distal portion 18c (e.g. in the form of a square) and an intermediate portion 18b (e.g. in the form of a straight line or zig-zag line), and a proximal portion 18a. The distal portion 18c can serve as a redistribution pad 16.

Referring back to FIG. 13, also shown is a sensor device 20, e.g. an absolute pressure sensor or an infrared sensor, in the example shown, mounted on top of the processing device 10' and attached thereto in any suitable manner, for example by soldering or glueing. Pads 21 of the sensor chip 20 can be electrically connected to the distribution pads 16 via first bonding wires 34, and thus indirectly to the aluminum pads 12 of the processing device 10'.

A plastic moulding 32 is applied over at least the OPM 17 (see left and right of FIG. 13) over aluminum pad 11, and over the proximal portion 18a and part (at least over a length "L2") of the intermediate portion 18b of the OPM 18. The longer the distance "L2", the longer the distance that a corrosive particle needs to travel along diffusion path "P1" before reaching the aluminum pad 12. Of course also the thickness "H" of the plastic compound 32 should be sufficiently large, because corrosive particles can also travel e.g. along a second diffusion path "P2" through the plastic compound (over distance H) to reach the bottom of the OPM 18, and then diffuse through the seed layer 15 over a distance Wo-Wp (see FIG. 12) located between the processing device 10' and the OPM 18a to reach the aluminum pad 12. The skilled person having the benefit of this disclosure can easily find suitable dimensions for the value "L2" and for the value "H", for example by trial and error.

As can be seen in FIG. 13, optionally a gel 38 may also be added in the cavity 36, preferably a fluoro gel. In this way direct contact between corrosive particles from the exhaust gas and the bonding wires 34 can be avoided, but such a gel still allows a pressure to be sensed.

Figure 14:
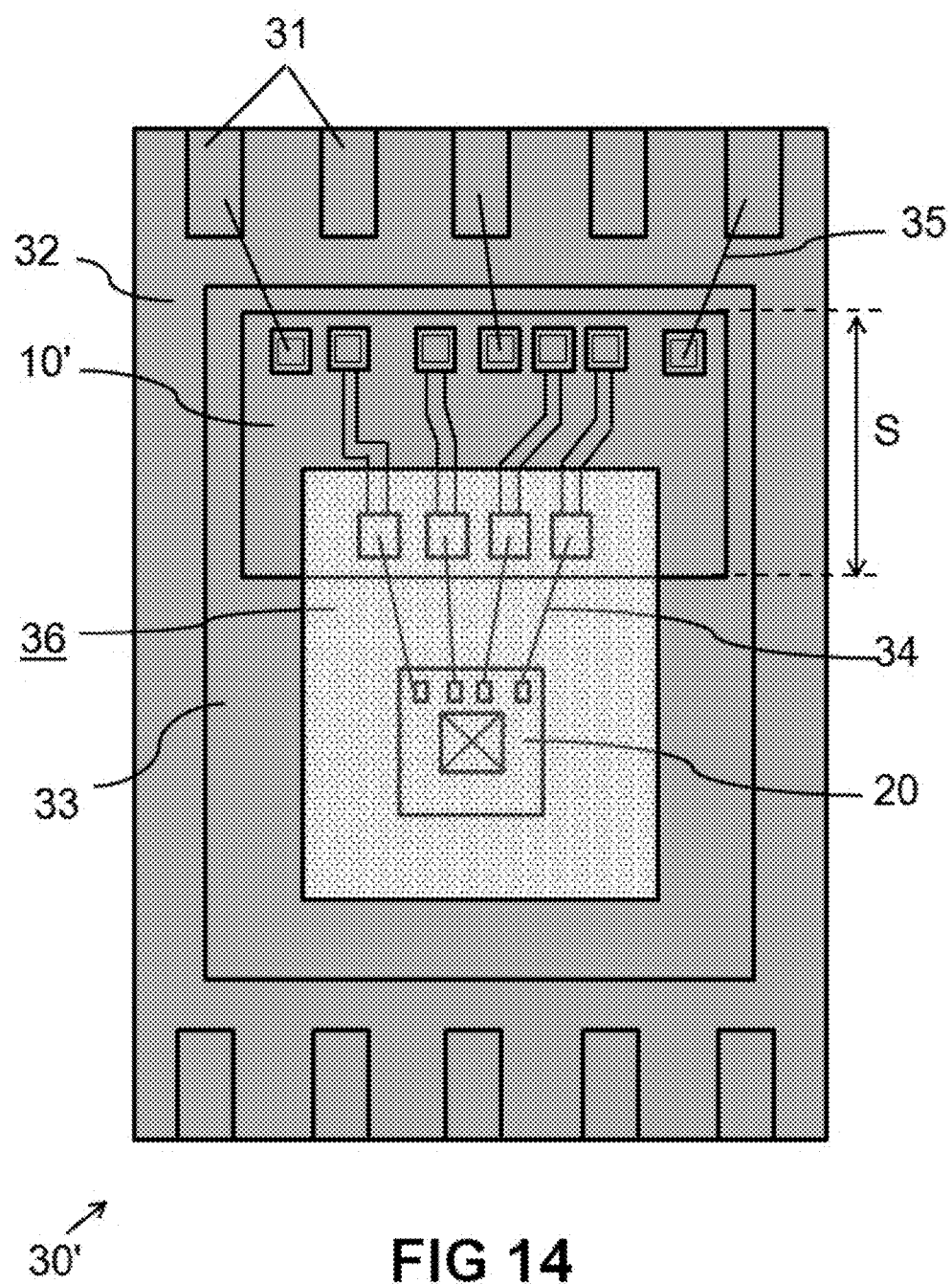
FIG. 14 shows a variant of the sensor assembly shown in FIG. 12 in top view. The processing device is mounted on top of a lead frame. The sensor device is also mounted on top of the lead frame, adjacent the processing device.

FIG. 14 shows a variant of the sensor assembly shown in FIG. 12. Everything described above for the embodiment of FIG. 12 and FIG. 13 is also applicable here, except for the following differences: (a) the size of the processing chip 10' is smaller; (b) the sensor chip 20' is not mounted on top of the processing device 10', but is mounted adjacent the processing chip 10', e.g. directly on the substrate 33; and (c) the substrate 33 may optionally have an opening 39 (see FIG. 15) for providing fluid access to the sensor device 20'.

Figure 15:
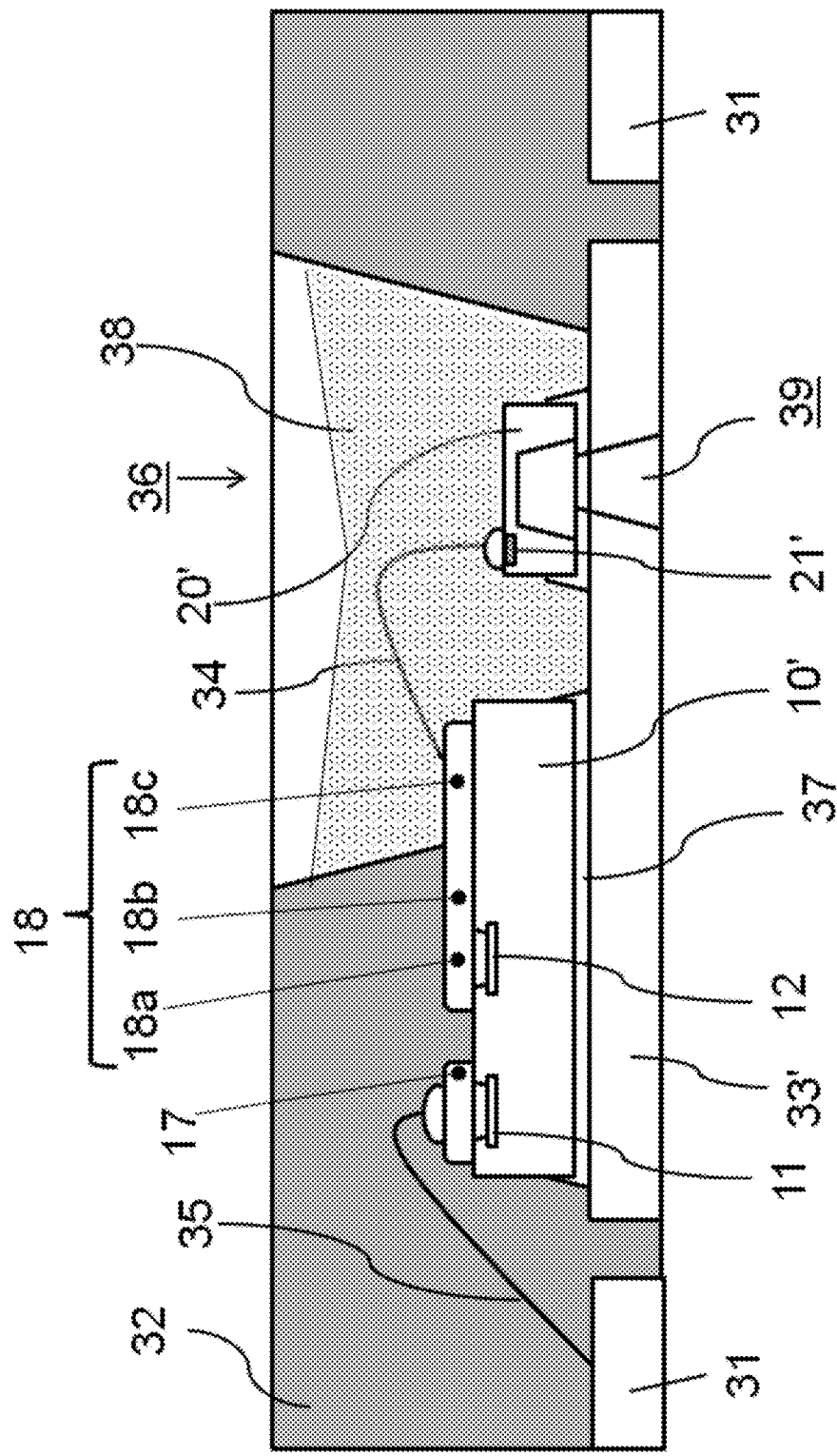
FIG. 15 shows a sensor assembly similar to that shown in FIG. 14 in side view (but some pads are shifted for illustrative purposes).

FIG. 15 can be considered as a side view of a sensor assembly 30' of FIG. 14, except that some pads 12 are shifted for illustrative purposes (to clearly show the difference between OPM 17 having only a proximal portion, and OPM 18 having a proximal portion and a distal portion and an intermediate portion). As can be seen, the sensor chip 20' is mounted on the substrate 33 adjacent the processing chip 10'. This embodiment is ideally suited for building a sensor assembly having a relative pressure sensor 20'.

In a variant of FIG. 14 and FIG. 15, the substrate 33 does not have an opening 39, and the sensor device 20' may be an absolute pressure sensor or an infrared sensor. The gel 38 may optionally be present.

Figure 16:
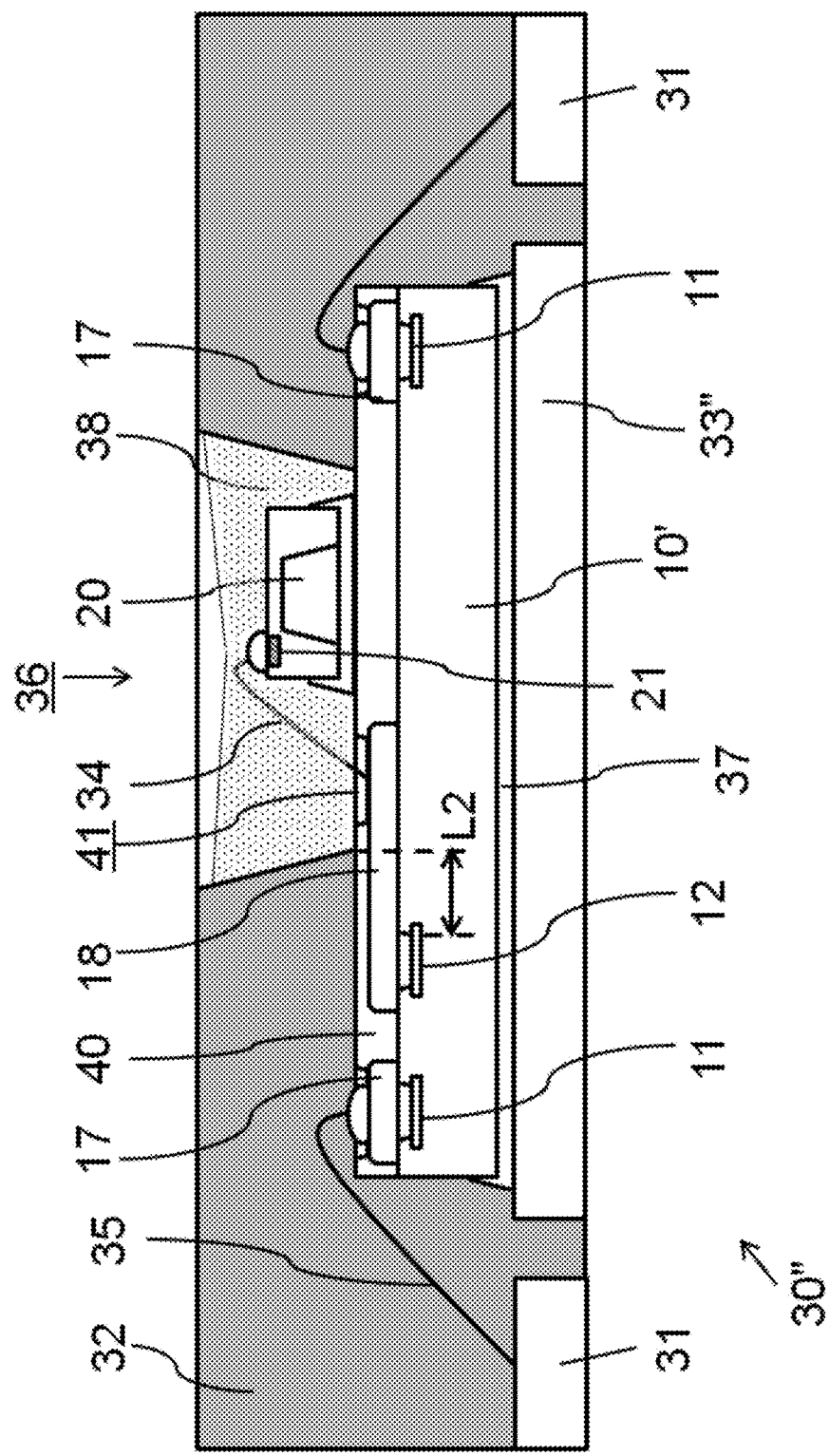
FIG. 16 shows a sensor assembly similar to that shown in FIG. 13 in side view, with an additional passivation layer on top of the overpad metallization.

FIG. 16 shows a sensor assembly 30" which can be considered to be another variant of the sensor assembly shown in FIG. 13. The main difference is that in the sensor assembly 30" of FIG. 16 an additional passivation layer 40 is put on top of the overpad metallization 17, 18, for example consisting of poly-imide or PBO (polybenzoxazole). A contact opening 41 is provided for allowing connection of the bond wire 34. An important effect of this additional passivation layer 40 is that it prevents exposure of an end of the seed layer 15, and that it closes the pinholes.

Although not shown, such an additional passivation layer can also be added to the embodiment of FIG. 15. In other words, the presence of the additional passivation layer 40 is not related to the kind of sensor (e.g. absolute or relative pressure sensor or infrared sensor), or to the arrangement of the sensor (e.g. on top of of adjacent the processing chip).

The sensor assemblies described above, especially those where the sensor device is stacked on top of the processing device provide a very compact sensor assembly. In particular, packages with outer dimensions smaller than 5 mm×10 mm×8 mm, for example smaller than 2.4 mm×5.0 mm×4.0 mm, for example smaller than 2.0 mm×3.0 mm×3.0 mm, for example smaller than 1.5 mm×2.0 mm×2.0 mm are envisioned.

Figure 17:
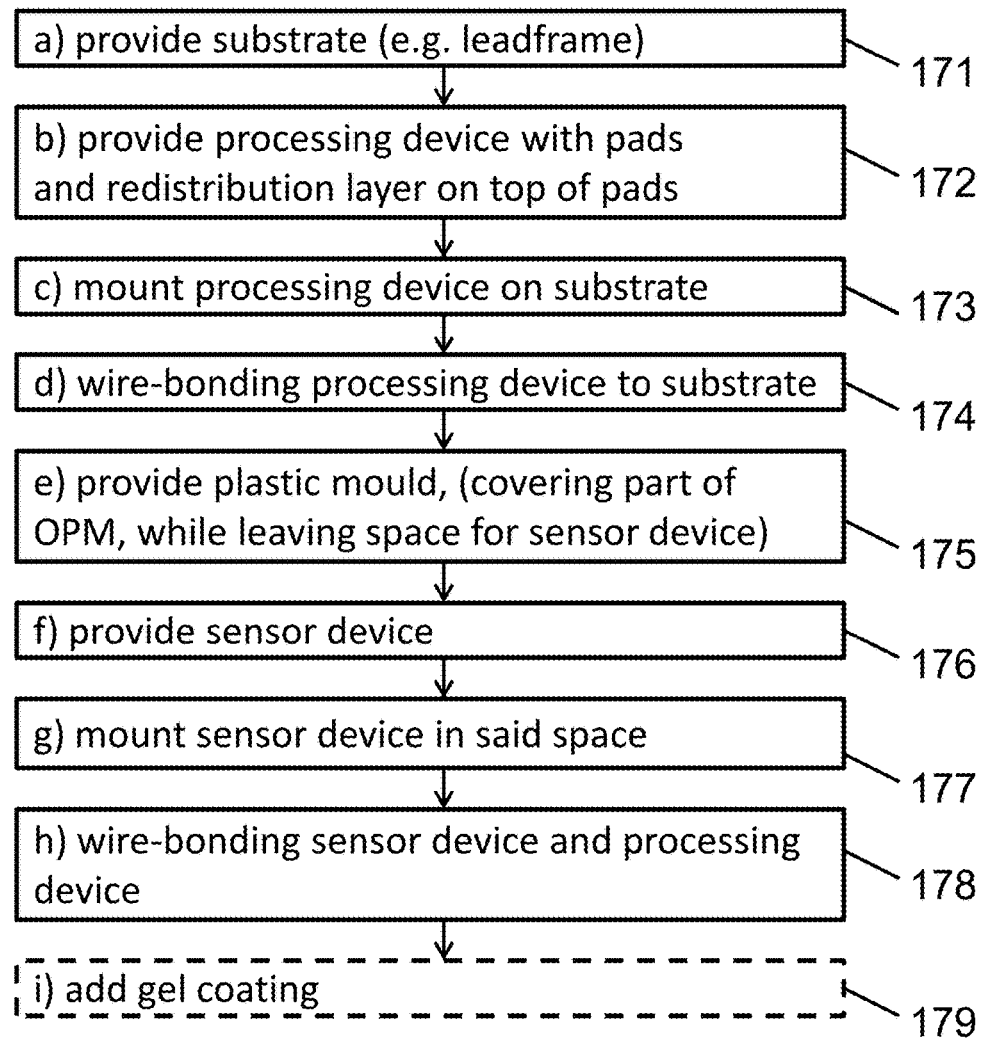
FIG. 17 shows a method of producing a sensor assembly according to en embodiment of the present invention.

FIG. 17 shows a method of producing a sensor assembly according to embodiments of the present invention. The method comprises:

a step of providing 171 a substrate, e.g. a lead frame;

a step of providing 172 a processing device 10' with aluminum pads and OPM 17, 18 on top of the aluminum pads, the OPM consisting of a first corrosion resistant material (e.g. a CMOS chip with a gold layer having a thickness of for example 5µm, deposited by sputtering or electroplating over aluminum pads 11, 12;

a step of mounting 173 the processing device 10' on the substrate, e.g. by soldering or by glueing;

a step of wire bonding 174 the processing device 10' to the substrate by providing wire bonds 35 made of a third corrosion resistant material, e.g. gold;

a step of partly overmoulding 175 the processing device 10' in the manner described above (i.e. by covering at least the OPM17, and by covering at least the first portions 18a and part of the second portions 18b of the OPM 18, while leaving space, e.g. an opening or a cavity for mounting a sensor device);

a step of providing 176 a sensor device, made in a technology suitable for being exposed to the exhaust gas environment, for example having a suitable passivation layer and having pads made of a second corrosion resistant material, e.g. gold or platinum or tantalum;

a step of mounting 177 the sensor device in said space or in said cavity, for example on top of the processing device 10' (see e.g. FIG. 13 or FIG. 16, or adjacent the processing device 10' (see e.g. FIG. 15), e.g. by soldering or by glueing;

a step of wire bonding 178 the processing device 10' to the substrate and to the sensor chip, by providing wire bonds 34 made of a third corrosion resistant material, e.g. gold.

The method may optionally comprise a further step 179 of adding a gel coating on top of the sensor device 20, 20'.

Figure 18:
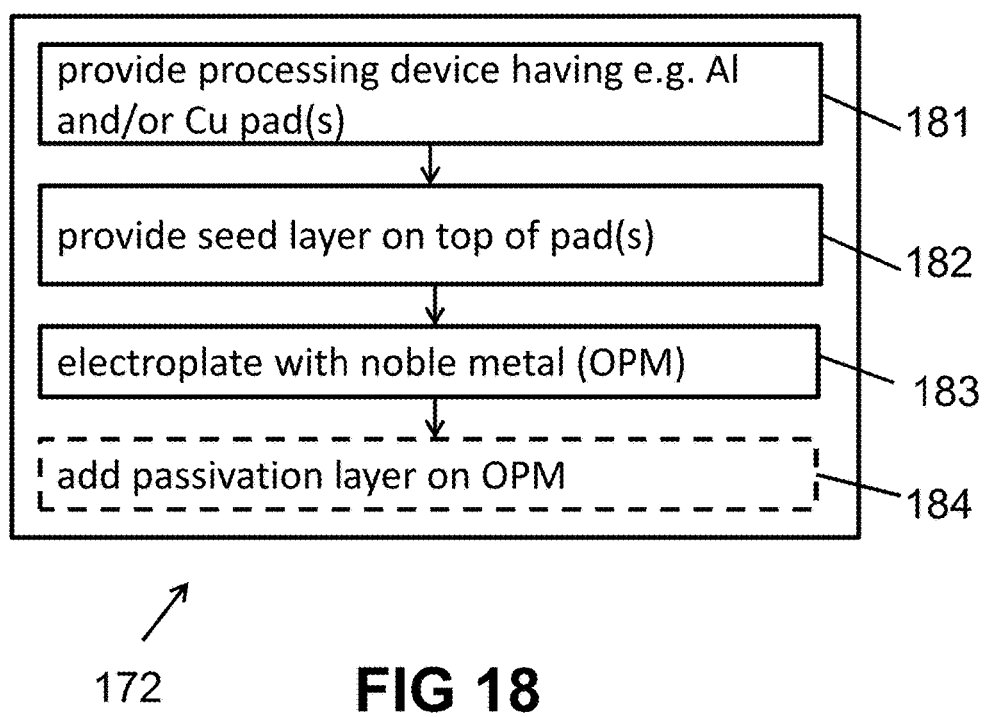
FIG. 18 shows one of the steps of FIG. 17 in more detail.

As illustrated in FIG. 18, the step 172 of providing the processing device 10' may comprising the following sub-steps:

providing 181 a processing device 10, e.g. a CMOS device having aluminum pads 11, 12;

optionally providing 182 a seed layer 15 on top of the aluminum pads 11, 12, the seed layer may comprise for example TiW/Au;

applying 183 an overpad metallization layer OPM 17, 18 by sputtering or by electroplating with the first corrosion resistant material, preferably a noble metal or alloy consisting of noble metals; optionally adding 184 an additional passivation layer 40 (e.g. poly-imide) on top of the OPM 18 and making openings 41 for allowing access to the OPM 18.

The OPM layer can also be deposited by any other suitable technique, such as e.g. by sputtering.

The invention claimed is:

1. A semiconductor sensor assembly for use in a corrosive environment, the sensor assembly comprising:
a processing device comprising at least one first bondpad of a material which may be corroded by a corrosive component in the corrosive environment;
a sensor device comprising at least one second bondpad, the second bondpad consisting of and/or being covered by a first corrosion resistant material;
at least one bonding wire for making a signal connection between the at least one first bondpad of the processing device and the at least one second bondpad of the sensor device;
wherein the processing device is partially overmoulded by a second corrosion resistant material, and is partially exposed to a cavity in the corrosion resistant material, the sensor device being present in the cavity; and
wherein a redistribution layer is provided to enable signal connection between the processing device and the sensor device to be physically made in the cavity while the second corrosion resistant material covers the at least one first bondpad.

2. A semiconductor sensor assembly according to claim 1, wherein the redistribution layer comprises an overpad metallization.

3. A semiconductor sensor assembly according to claim 2, wherein the overpad metallization consists of a third corrosion resistant material, the overpad metalization having a shape comprising a proximal portion and a distal portion, the distal portion being located at a distance from the proximal portion and being connected to the proximal portion via an intermediate portion, the proximal portion having a shape covering the at least one first bondpad.

4. A semiconductor sensor assembly according to claim 3, wherein the bonding wire has a first end connected to the distal portion of the overpad metalization, and a second end connected to the at least one second bondpad of the sensor device, the bonding wire consisting of a fourth corrosion resistant material.

5. A semiconductor sensor assembly according to claim 1, wherein the first corrosion resistant material and/or the third corrosion resistant material and/or the fourth corrosion resistant material is individually selected from one of the following alternatives:
a noble metal;
only gold;
only platinum;
a mixture consisting of only Au and Pt;
an alloy containing Au or Pt.

6. A semiconductor sensor assembly according to claim 1, wherein the sensor device is mounted on top of a substrate and adjacent the processing device.

7. A semiconductor sensor assembly according to claim 1, wherein the sensor device is located on top of the processing device.

8. A semiconductor sensor assembly according to claim 1, further comprising a passivation layer on top of the redistribution layer.

9. A semiconductor sensor assembly according to claim 1, further comprising a gel applied on top of the sensor device.

10. A semiconductor sensor assembly according to claim 1, comprising a substrate, wherein the substrate is a lead frame.

11. A semiconductor sensor assembly according to claim 1, wherein the processing device further comprises third bondpads connected to a substrate via second bonding wires, the second bonding wires also being encapsulated by the second corrosion resistant material.

12. A semiconductor sensor assembly according to claim 1, wherein the processing device is a CMOS chip, and the sensor device made in a different technology.

13. A semiconductor sensor assembly according to claim 12, wherein the CMOS chip comprises a microprocessor and a non-volatile memory.

14. A semiconductor sensor assembly according to claim 1, having outer dimensions smaller than 5 mm×10 mm×8 mm.

15. A semiconductor sensor assembly according to claim 1, wherein the sensor device is an absolute pressure sensor or a differential pressure sensor or an infrared sensor.

16. Use of a semiconductor sensor assembly according to claim 15 for measuring a pressure and/or a composition of an exhaust gas of an automobile engine.

* * * * *